United States Patent
Drexel

(10) Patent No.: US 8,362,443 B2
(45) Date of Patent: Jan. 29, 2013

(54) OBJECTIVE LENS

(75) Inventor: Volker Drexel, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/449,435

(22) Filed: Apr. 18, 2012

(65) Prior Publication Data

US 2012/0205550 A1 Aug. 16, 2012

Related U.S. Application Data

(60) Division of application No. 12/551,783, filed on Sep. 1, 2009, now Pat. No. 8,178,849, which is a continuation of application No. PCT/EP2008/001797, filed on Mar. 6, 2008.

(30) Foreign Application Priority Data

Mar. 6, 2007 (DE) .................. 10 2007 010 873

(51) Int. Cl.
*H01J 3/20* (2006.01)

(52) U.S. Cl. ............... 250/396 ML; 250/306; 250/310; 250/311; 250/396 R; 250/492.1

(58) Field of Classification Search ............ 250/396 R, 250/396 ML, 306, 307, 309, 310, 311, 491.1, 250/492.1, 492.2, 492.3
See application file for complete search history.

(56) References Cited

U.S. PATENT DOCUMENTS

| | | | |
|---|---|---|---|
| 4,713,543 A | 12/1987 | Feuerbaum et al. | |
| 4,785,176 A | 11/1988 | Frosien et al. | |
| 4,831,266 A | 5/1989 | Frosien et al. | |
| 4,926,054 A * | 5/1990 | Frosien .................. | 250/396 R |
| 5,371,371 A | 12/1994 | Yamazaki et al. | |
| 5,442,183 A | 8/1995 | Matsui et al. | |
| 5,736,742 A * | 4/1998 | Ochiai .................. | 250/396 R |
| 6,037,589 A | 3/2000 | Yonezawa et al. | |
| 6,104,034 A * | 8/2000 | Frosien et al. ........... | 250/396 R |
| 6,107,633 A * | 8/2000 | Frosien et al. ........... | 250/396 ML |
| 6,498,345 B1 * | 12/2002 | Weimer et al. ............ | 850/9 |
| 6,590,210 B1 * | 7/2003 | Essers .................. | 850/9 |
| 6,855,938 B2 | 2/2005 | Preikszas et al. | |
| 6,891,167 B2 * | 5/2005 | Notte, IV ............... | 250/396 ML |
| 2004/0218723 A1 | 11/2004 | Okada et al. | |
| 2006/0284090 A1 * | 12/2006 | Koops et al. ............. | 250/310 |
| 2008/0210887 A1 * | 9/2008 | Buschbeck et al. ........ | 250/492.2 |
| 2008/0230694 A1 * | 9/2008 | Frosien ................. | 250/307 |

FOREIGN PATENT DOCUMENTS

| | | |
|---|---|---|
| DE | 198 51 097 | 5/1999 |
| DE | 198 45 329 A1 | 9/1999 |
| DE | 102 33 002 B4 | 2/2004 |
| EP | 0 910 108 | 4/1999 |
| EP | 0 910 109 | 4/1999 |
| EP | 0 952 606 | 10/1999 |
| EP | 1 557 866 | 7/2005 |
| JP | 60 074250 | 4/1985 |
| JP | 08064163 A | 3/1996 |
| JP | 08203459 A | 8/1996 |
| JP | 2000 182558 | 6/2000 |

(Continued)

*Primary Examiner* — Michael Logie
(74) *Attorney, Agent, or Firm* — Fish & Richardson P.C.

(57) ABSTRACT

An objective lens for focussing charged particles includes a magnetic lens and an electrostatic lens whose components are displaceable relative to each other. The bore of the outer pole piece of the magnetic lens exhibits a diameter $D_a$ which is larger than a diameter $D_i$ of the bore of the inner pole piece of the magnetic lens. The following relationship is satisfied: $1.5 \cdot D_i \leq D_a \leq 3 \cdot D_i$. The lower end of the inner pole piece is disposed in a distance of at least 2 mm offset from the inner end of the outer pole piece in a direction of the optical axis.

20 Claims, 5 Drawing Sheets

FOREIGN PATENT DOCUMENTS

| | | |
|---|---|---|
| JP | 2000 243336 | 9/2000 |
| JP | 2006 252994 | 9/2006 |
| WO | WO 2005/071709 | 8/2005 |
| WO | WO2005/071709 A2 * | 8/2005 |

* cited by examiner

OBJECTIVE LENS

CROSS-REFERENCE TO RELATED APPLICATIONS

This application is a divisional application of U.S. application Ser. No. 12/551,783, filed Sep. 1, 2009, which is a continuation of, and claims benefit under 35 USC 120 to, international application PCT/EP2008/001797, filed Mar. 6, 2008, which claims benefit of German Application No. 10 2007 010 873.9, filed Mar. 6, 2007. U.S. application Ser. No. 12/551,783 and International application PCT/EP2008/001797 are hereby incorporated by reference in their entirety.

FIELD

The disclosure relates to an objective lens for focussing charged particles and to a particle-optical system with such an objective lens.

BACKGROUND

Generally, in technology an accelerating tendency for miniaturizing can be observed and the thereby evolving fields of micro- and nanotechnology involve a demand for instruments that allow to manufacture such tiny systems and/or to inspect these. Especially the components and structures in the field of semiconductor technology, becoming smaller and more complex, involve particle-optical systems for inspecting and manufacturing the sub-micrometer sized functional components, wherein these particle-optical systems ought to provide a sufficiently high resolution. For focussing the charged particles, magnetic lenses, alone or in combination with electrostatic lenses, are conventionally used in such particle-optical systems. The achieved resolution in such a system substantially depends on the imaging properties of the system as a whole.

A known embodiment of a magnetic lens is referred to as "single pole" lens or also "Snorkel" lens and generally includes a single, usually conical pole piece which, exited by a coil, generates a magnetic field in the region of an object to be inspected.

Magnetic lenses with so-called axial pole piece gap are known as well. Such lenses usually include two pole pieces extending in a direction towards an object plane of the objective lens. The inner diameters of the pole pieces are of equal size at their ends disposed closest to the object. Thereby, an axial gap is formed arranged substantially parallel to an optical axis of the magnetic lens and the ends of the pole pieces are arranged at the same distance from the optical axis. Compared to the single pole ("Snorkel") lens, for which the generated magnetic field extends a far amount into the space located in front of the objective lens and thus includes the object, the magnetic lens with an axial pole piece gap has a characteristic steep decrease of the magnetic field.

Combination lenses formed of a magnetic lens and an electrostatic lens are known. In these types of lenses, the electrostatic lens may for example be arranged in form of an immersion lens inside the magnetic lens, such that electrostatic field and magnetic field overlap.

SUMMARY

In some embodiments, the disclosure provides an objective lens having a magnetic lens which exhibits good particle-optical properties and enables good resolution, even at small working distances.

In certain embodiments, the disclosure provides an objective lens having a magnetic lens and an electrostatic lens which allows a satisfactory adjustment of the magnetic lens and the electrostatic lens relative to each other.

In some embodiments, the disclosure provides an objective lens for focussing charged particles that includes a magnetic lens and an electrostatic lens. The magnetic lens has an inner pole piece and an outer pole piece. A gap is formed between a lower end of the inner pole piece and an inner end of the outer pole piece. The electrostatic lens has an electrode arrangement for generating an electrostatic field. The electrode arrangement includes a first electrode and a second electrode offset from each other in a direction traverse to the charged particles. The magnetic lens and the electrostatic lens are adapted to be displaceable relative to each other, such as in a direction transverse to the direction of traversal of the charged particles. The objective lens further includes an actuator for changing a position of the first electrode and the second electrode of the electrostatic lens relative to a position of the magnetic lens.

The electrostatic lens and the magnetic lens may be at least partially displaceable relative to each other.

The actuator may be adapted for changing a position of the first and/or the second electrode relative to a position of the magnetic lens.

The actuator may be an active element for causing a position to change, such as a motor, or may also be a mediator of a driving force without actually providing the driving force by itself. Thereby, an external driving force may be transferred by the actuator to cause the changing a position.

The charged particles may be electrons, ions, muons or any other suitable particles.

In some embodiments, the inner and the outer pole pieces are disposed at a same side of an object to be processed or to be inspected. Between the inner and the outer pole piece a coil is arranged generating a magnetic flux when an electric current is present.

Thereby an objective lens is provided which allows in an advantageous manner an adjustment of the magnetic lens relative to the electrostatic lens. In contrast to conventional systems in which the electrostatic lens is often fixed to the magnetic lens, the magnetic lens and the electrostatic lens disclosed herein are held displaceable relative to each other so that both lenses may be adjusted relative to each other, as desired. Further, an actuator is provided to achieve the relative displacement in a precise and controlled manner. Providing an actuator allows for automated displacement and therefore displacement during an operation of the objective lens, such as while charged particles traverse the objective lens.

In some embodiments, the magnetic lens as well as the electrostatic lens are each substantially rotationally symmetric around a respective optical axis. By the adjustability of the objective lens such an accurate alignment and correspondence of the optical axes of the magnetic and electrostatic lens can be achieved that during focussing no shift of image details, such as portions of an imaged object, occurs. In contrast, in known objective lenses such a disturbing effect can arise in spite of substantial efforts with respect to aligning the magnetic and the electrostatic lens relative to each other.

In some embodiments, an objective lens for focussing charged particles includes a magnetic lens and an electrostatic lens. The magnetic lens has an inner pole piece and an outer pole piece. A gap is formed between a lower end of the inner pole piece and an inner end of the outer pole piece. The electrostatic lens has an electrode arrangement for generating a focusing electrostatic field. The electrode arrangement includes a first electrode and a second electrode offset from each other in a direction of traversal of the charged particles. The inner pole piece and the outer pole piece of the magnetic lens are displaceable relative to each other, such as in a direction transverse to the direction of traversal of the charged particles. The first electrode and the second electrode of the electrostatic lens are displaceable relative to each other, such as in a direction transverse to the direction of traversal of the charged particles. The objective lens further includes an actuator for displacing the inner pole piece and the outer pole piece relative to each other and for displacing the first electrode and the second electrode relative to each other.

In certain embodiments, the first electrode is configured as a beam tube traversing the inner pole piece. A gap between an outer circumferential surface of the beam tube and an inner circumferential surface of the inner pole piece is at least partly filled by an annular member, such as a tubular member, which can be made from insulating material, for holding the beam tube and the inner pole piece in a fixed position relative to each other.

In some embodiments, the objective lens further includes a connector for holding the first electrode and the inner pole piece in a fixed position relative to each other.

In certain embodiments, the actuator may for example be particularly adapted to change at least the position of the second electrode relative to the position of the magnetic lens. Further, the actuator may be adapted to change the position of the first electrode relative to the position of the second electrode. In other embodiments also a further actuator may be provided. The actuator may further be designed to change a position of the inner pole piece relative to a position of the outer pole piece or adjust these positions.

Changing the relative position of the electrode/electrodes or the respective pole piece may be achieved substantially orthogonally to the direction of traversal of the charged particles (orthogonally to the optical axis of the magnetic or electrostatic lens), which may be substantially in a radial direction. In particular, changing the relative positions may be in a direction transverse to the direction of traversal of charged particles. Alternatively or additionally, changing the relative position of the respective electrode or/and the respective pole piece may occur substantially parallel to the direction of traversal of the charged particles (in an axial direction). In exemplary embodiments, the actuator allows an axial changing the position (a radial changing the position of a respective electrode or of a respective pole piece to be performed independently of each other). However, it is also conceivable that changing the positions are performed in both directions concurrently. Also, a component may be provided which synchronously causes an axial as well as a radial changing the position/positions. The actuator may be designed to be a single actuator or may also be designed to include plural, for example also independently acting or operable, actuators or actuator elements.

In exemplary embodiments, the second electrode is a terminal electrode continuing, in a direction towards an object plane of the objective lens, from the outer pole piece in a direction of traversal of the charged particles and is offset from the first electrode, in particular along the same direction. The terminal electrode may for example include a disk having an aperture for traversal of the charged particles (an annular electrode). The terminal electrode may also be conically constructed. Usually in particle-optical systems, the charged particles are focussed at an object plane of the objective lens, which means usually at a plane in which also the object to be inspected or to be processed is arranged. Herein, objective plane refers to the plane in which the object is arranged or in which the object is arrangeable, also in such embodiments, in which the objective lens is adapted, to focus charged secondary particles to a detector. Thus, the detector could be considered to be the objective plane in optical respects. Accordingly, the terms "upper" and "lower" are to be understood as disposed farther away from the object plane (closer to the objective plane). Secondary particles are understood to include all particles generated by interaction of primary particles generated by a source with an object, particles backscattered from the object and also reflected particles.

The first electrode may for example be configured as a beam tube at least partially traversing the inner pole piece. In an exemplary embodiment, a lower end of the beam tube may substantially lie in a same plane as the inner end of the outer pole piece. In such an embodiment, an advantageous positioning of the electrostatic field generated by the electrostatic lens relative to a magnetic field generated by the magnetic lens is achieved.

In an exemplary embodiment, the second electrode includes a portion extending from the outer pole piece towards the object plane.

The electrostatic lens allows deceleration of charged particles having a high acceleration voltage and thus having high kinetic energy immediately before impinging onto the object plane by generating an electrostatic retarding field. Thus, by using such a combination lens, significantly improved imaging properties may be achieved, for example with respect to chromatic and aperture errors.

In some embodiments, the objective lens includes a first sealing member adapted and configured to prevent a pressure balancing via an interspace between a lower portion of the first electrode and the inner end of the outer pole piece; and a second sealing member adapted and configured to prevent a pressure balancing via an interspace between an upper end of the first electrode and the inner pole piece. Thus, a gas flow through the interspace between the upper end of the first electrode and the inner pole piece is prevented and a gas flow through the inter space between the lower portion of the first electrode and the inner end of the outer pole piece is prevented. Each sealing member may be a single sealing member or may be assembled from several components. The first sealing member serves to prevent that a gas flow occurs between the lower part of the first electrode and the outer pole piece. Thereby, an inner space of the magnetic lens and a space between the first electrode and the magnetic lens is sealed against a through-flow of gas. The sealing member may for example displaceably directly be coupled to the outer pole piece and the first electrode or may contact these, and may be configured as a sealing ring. Also, the sealing member may for example be made from a concurrently isolating ceramic material or may include such a material. The sealing members for example also include bellows and optionally bellows suitable for ultra high vacuum. Moreover the sealing members may include metal seals, metal bellows or other suitable sealings which optionally are suitable for ultra high vacuum.

In some embodiments, a particle-optical system having an objective lens, such as with a first sealing member and a second sealing member, as described above, is provided which further includes a vacuum chamber having a vacuum chamber wall for accommodating an object to be examined. The actuator, the first sealing member and the second sealing member are arranged such that the actuator and/or at least a handling element for handling the actuator are disposed in a space separated from the vacuum chamber.

This particle-optical system thus allows in an advantageous way an adjustment of the electrostatic lens relative to the magnetic lens during the operation of the particle-optical system (during the traversal of charged particles through the objective lens).

The particle-optical system may for example be a microscope or a lithographic system, or for example a lithographic system having an observation mode. The system may be a scanning electron microscope. The microscope may further include a gas supply, to perform additive or substractive lithography using reactive gases in combination with charged particles (to deposit material onto the object, or ablate material from the object) using the beam of charged particles.

In exemplary embodiments, the objective lens further includes an electrode holder adapted to hold the first and optionally also the second electrode.

The electrode holder may for example include an insulating, for example ceramic, element. The second electrode may suitably be fixed to this insulating ceramic element. The insulating ceramic element may at the same time also serve as a sealing member and may for example be configured as a ring having an aperture for traversal of the charged particles. The insulating ceramic element itself may for example be fixed to a suitable component of the objective lens (of the particle-optical system) using a bracket or another suitable holding mechanism. This component can be different from a component of the magnetic lens. The bracket or holding mechanism may for example extend approximately parallel to an outer side of the outer pole piece. The insulating ceramic element may further also be fixed to a lower end of the first electrode such that a relative position of the first electrode and the second electrode relative to each other may be fixed while it is concurrently enabled to apply (different) potentials to the electrodes independently. The insulating ceramic element may at the same time function as a first sealing member (part of a first sealing member).

Beside ceramic materials also any other suitable insulating materials may be utilized.

In exemplary embodiments, the electrode holder is displaceably held relative to the inner pole piece as well as relative to the outer pole piece. A changing the position of the second and possibly concurrently also the first electrode includes a changing the position of the electrode holder relative to the magnetic lens.

In an exemplary embodiment of a particle-optical system, the electrode holder is vacuum tightly connected to the vacuum camber wall. In the configuration of the electrode holder, in particular also of the insulating member of the electrode holder mentioned above, as a sealing member, thus, a separation of the vacuum space defined within vacuum space walls from a space in the region of the magnetic lens can be achieved. In this respect, also the second sealing member contributes which member separates the space accommodating the magnetic lens from the vacuum space inside the vacuum chamber and which member provides a connection of an inside of the second electrode, such as of the beam tube, to a portion of the vacuum system of the particle-optical system continuing in a direction opposite to a direction towards the object plane.

The actuator may for example include a first actuator which is configured to shift the electrostatic lens, in particular the second and/or the first electrode, relative to the outer pole piece. Such an actuator may for example be provided by a screw causing a radial shift of the magnetic lens. A further actuator may include another screw which is adapted and configured to radially shift the inner pole piece relative to the outer pole piece. In exemplary embodiments, the changing the position of the second electrode is achieved by a displacement of the electrode holder holding the second electrode.

There may be further actuators or actuator arrangements provided for causing a positionally changing in at least one other direction, for example in the axial direction.

Further, the actuator may include an actuator member which is adapted and arranged to displace the second electrode relative to the first electrode. The actuator member may be configured to achieve a positional changing in an axial and/or radial direction.

In certain embodiments, an objective lens for focussing charged particles is provided that includes a magnetic lens having an optical axis, an inner pole piece and an outer pole piece. A gap is formed between a lower end of the inner pole piece and an inner end of the outer pole piece. The outer pole piece has a substantially conical shape having a diameter $D_a$ at its inner end and wherein the inner pole piece has a diameter $D_i$ at its lower end. The lower end of the inner pole piece is arranged at a distance H, when measured along a direction of the optical axis, apart from the inner end of the outer pole piece. Further, the inner end of the outer pole piece is a functional part of the magnetic lens disposed closest to an object plane of the objective lens and the following conditions are fulfilled:

$$1.5 \cdot D_i \leq D_a \leq 3 \cdot D_i$$

and
$25° \leq \alpha \leq 70°$, in particular
$30° \leq \alpha \leq 60°$, more in particular
$40° \leq \alpha \leq 50°$, wherein $$\alpha = \arctan((D_a - D_i)/(2 \cdot H)).$$

Thereby, a magnetic lens having a gap formed by the inner pole piece and the outer pole piece is realized, wherein the gap is tilted relative to the optical axis. This magnetic lens enables to generate a magnetic field having a particularly advantageous distribution, in particular relative to an object to be inspected or to be processed.

In other words, the objective lens does not include any further functional parts which would displace the magnetic field generated by the inner and the outer pole piece substantially compared to a magnetic field generated by the inner and outer pole piece only (in the absence of further parts). In particular, the objective lens does not include any further functional parts by which the shape of the magnetic field would change as a consequence of adding them. Parts or components disposed offset from the magnetic lens in a direction towards the objective plane are substantially not magnetizable and do not substantially guide magnetic flux which is also guided through the outer pole piece. Components disposed offset from the magnetic lens in a direction towards the object plane may include for example components of an electrostatic lens, such as electrodes, isolators and their holding structures. Substantially not magnetizable materials are for example materials which relative permeability $\mu_i \leq 1.001$.

In exemplary embodiments, the lower end of the inner pole piece is disposed, in a direction of the optical axis which at the same time defines the direction of traversal of the charged particles through the magnetic lens, in a distance of at least 2 mm, in particular 3 mm, from the inner end of the outer pole piece. This distance is also denoted as H. In further exemplary embodiments, H is at most 10 mm.

In exemplary embodiments, a distance between the lower end of the inner pole piece and the first electrode is 7.5 mm or more.

These distances refer to distances between the respective lowest (disposed closest to the objective plane) surfaces of the respective pole piece ends or of the electrode.

Further, it is advantageous to arrange the inner pole piece and the outer pole piece such that they are displaceable relative to each other. In advantageous embodiments, the objective lens in accordance with features of embodiments described above, includes a first actuator that is configured to change a position of the inner pole piece relative to a position of the outer pole piece.

Further, the objective lens includes in exemplary embodiments an electrostatic lens having an electrode arrangement for generating an electrostatic field, wherein the electrode arrangement includes a first electrode and a second electrode offset from each other in a direction of the optical axis.

Such a combination lens formed by a magnetic lens having an angular (tilted) pole piece gap and an electrostatic lens provides particular advantages. In particular, such a combination lens allows for a fine focussing of the charged particles in the objective plane also for high acceleration voltages of the charged particles and also for small working distances. In particular, for small working distances the error coefficients of such a combination lens are smaller than for large working distances so that an improved resolution can be achieved. Compared to conventional combination lenses having an axial pole piece gap, the different positions of the magnetic field relative to the objective plane and relative to an electrostatic field generated by the electrostatic lens proves to be advantageous, since by a better overlap of the magnetic and electrostatic field smaller error coefficients are achieved and therefore better resolutions can be provided.

The small working distances also provide for high acceleration voltages the advantage that negative effects of perturbation fields occurring during an operation of particle-optical systems are smaller than for large working distances.

In an exemplary embodiment, the objective lens includes a second actuator adapted to change a position of the first electrode relative to the position of the second electrode and/or relative to the position of the outer pole piece. First and second actuators may be parts of a same actuator. Regarding possible embodiments of the actuators or actuator members it is referred to the description in the context of embodiments of the disclosure provided above.

In exemplary embodiments, the first electrode is a beam tube at least partially traversing the inner pole piece and the second electrode is a terminal electrode disposed offset from the beam tube and continuing, in a direction towards the object plane, from the outer pole piece towards the object plane. Further, the first actuator is adapted to displace the inner pole piece and/or the outer pole piece relative to the first and/or the second electrode of the electrode arrangement. Also several combinations regarding the configuration and functioning of the actuator or the actuators may be provided, as described further above.

Furthermore, the disclosure provides a particle-optical system having an objective lens according to some embodiments. The particle-optical system may include the features of embodiments of the particle-optical system described above.

A particle-optical system can have a separation of the vacuum space in the vacuum chamber from the space to accommodate the magnetic lens, which can enable in an advantageous manner disposing the actuator and/or at least a handling element for handling the actuator outside the vacuum and thus in a space in which atmospheric pressure may prevail.

A particle-optical system thus allows for changing the relative positions of the pole pieces relative to each other and/or changing the position of the magnetic lens relative to the position of the electrostatic lens during operation of the objective lens (the particle-optical system). Thus, good imaging properties of the objective lens can be achieved.

Typically, the particle-optical system includes, besides an objective lens, a source for generating charged particles, for example for generating a beam of charged particles, and an objective holder for disposing an object to be examined or to be processed in a desired position relative to the objective lens. Further, a particle-optical system may include a condenser lens and/or deflecting elements for deflecting the beam of charged particles. Particle-optical systems for inspecting further include one or plural detectors which are arranged in a region of the vacuum chamber or which are arranged as so-called in-lens detectors within the particle-optical system above the objective lens.

In some embodiments, the disclosure provides a method for adjusting (changing) the relative positions of the pole pieces of the magnetic lens or changing the magnetic lens relative to the electrostatic lens. The method may include the following. A source of electrostatic particles emits charged particle such that they are accelerated towards the object plane (towards the object) using an acceleration voltage of more than 5 kV. In a first method step low potentials are applied to the electrodes of the electrostatic lens. In this method step, the objective current (currents flowing through the excitation coil of the magnetic lens) is wobbled (varied to higher and lower values around an average current). During this wobbling the positions of the inner and outer pole pieces are shifted relative to each other until a center of an image generated by the charged particles in the objective plane moves minimally.

In a second method step a potential difference is applied across the first and the second electrode of the electrostatic lens. Using the magnetic lens, the charged particles are focussed to a working distance which is smaller than the distance corresponding to the focal point of the pure electrostatic lens having the potential difference applied. The working distance denotes the distance between the objective lens and the object (the objective plane). In this method step, exclusively the acceleration voltage with which the charged particles are accelerated towards the objective plane is wobbled. Using the actuator now the magnetic lens (commonly the inner and outer pole piece) is shifted relative to the electrostatic lens, until the center of the image does not move anymore, but instead only a transition from an overfocus to an underfocus occurs. This method step can be performed at acceleration voltages between 100 V and 5 kV, since in this voltage range the effect of the electrostatic lens dominates over the effect of the magnetic lens.

In the embodiments in which the actuator is also configured for positionally changing the second relative to the first electrode, such as where an additional actuator is provided for this purpose, a course of an adjusting may be carried out, for example according to the following method.

In a first method step, no potential difference is applied to the first and second electrode of the electrostatic lens (no electrostatic field is generated). The charged particles are accelerated in a direction towards the objective plane through the objective lens using an acceleration voltage of more than 5 kV. In this step the adjusting the magnetic lens is carried out by wobbling (by a continuous variation of the strength of the objective current, which means of the current flowing through the excitation coil of the magnetic lens) and shifting the inner and outer pole pieces relative to each other until the moving of the image center is minimized, in a manner described already above.

In a second step, the magnetic lens is switched off (a current through the excitation coil of the magnetic lens is switched off). A potential difference between the first and the second electrode of the electrostatic lens is applied, for example a potential of +8 kV may be applied to the first electrode and the second electrode may be grounded. Consequently, the object to be inspected is disposed in the focus of merely the electrostatic lens. For adjusting, the potential applied to the first electrode is subsequently wobbled and the second electrode is shifted relative to the first electrode, until a center of the image generated by the charged particles does not move anymore and transits only from an overfocus to an underfocus. In alternative embodiments of this step, also the acceleration voltage could be wobbled, while the potential applied to the first electrode is held constant.

In a third step, the object is disposed in a working distance which is smaller than the focal length of the electrostatic lens having applied the corresponding potential difference. The charged particles are focussed using the magnetic lens according to this smaller working distance. In the following, the acceleration voltage of the charged particles is wobbled. In this method step, the magnetic lens is shifted relative to the electrostatic lens until the image center does not move anymore but transits only from an over- to an underfocus. This step can be carried out at acceleration voltages between 100 V and 5 kV, since in this voltage range the effect of the electrostatic lens dominates over the effect of the magnetic lens.

BRIEF DESCRIPTION OF THE DRAWINGS

The forgoing as well as other advantageous features of the disclosure will be more apparent from the following detailed description of exemplary embodiments of the with reference to the accompanying drawings. It is noted that not all possible embodiments exhibit each and every, or any, of the advantages identified herein.

DETAILED DESCRIPTION OF EXEMPLARY EMBODIMENTS

Figure 1:
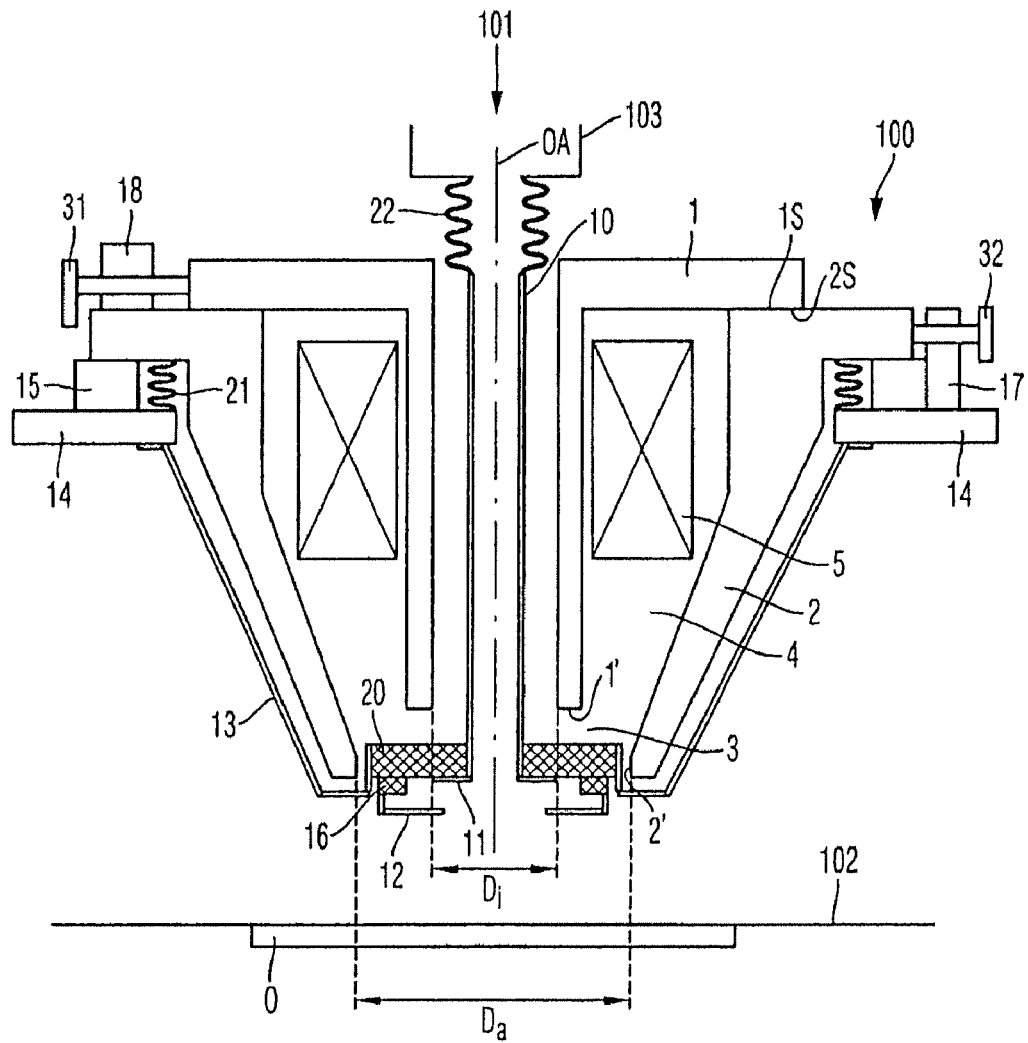
FIG. 1 is a schematic illustration of an objective lens.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

In FIG. 1 a first exemplary embodiment of an objective lens according to the present invention is illustrated. The objective lens includes a magnetic lens including an inner pole piece 1 having a lower end 1' and an outer pole piece 2 having an inner end 2'. Between the lower end 1' of the inner pole piece 1 and the inner end 2' of the outer pole piece 2 an angular (tilted with respect to an optical axis OA of the objective lens 100) pole piece gap 3 is formed. In an inner space 4 enclosed by the inner pole piece 1 and the outer pole piece 2 a coil 5 is arranged and provided to generate a magnetic flux in the inner and the outer pole pieces 1, 2. When an electric current flows through the coil 5, a magnetic field is generated within the inner and the outer pole pieces 1, 2 that substantially protrudes from the pole piece gap 3 in the region around the pole piece gap 3. The inner pole piece and the outer pole piece guide the magnetic field excited by the coil 5 and concentrate it within the pole pieces. The pole pieces oppose each other via the pole piece gap 3 such that the magnetic field is established in the pole piece gap having a predetermined strength and direction. Charged particles accelerated by a not illustrated source in a direction towards the objective plane 102 traverse the objective lens 100 in the direction of traversal 101 and thus traverse the magnetic field generated by the magnetic lens and are focussed at the objective plane 102. The inner pole piece 1 exhibits a cylinder formed section through which the charged particles traverse. The outer pole piece exhibits a conical section tapering in the direction towards the objective plane 102.

The objective lens 100 further includes an electrostatic lens. The electrostatic lens includes a beam tube 10 as a first electrode. The beam tube is arranged in the inside of the cylinder shaped section of the inner pole piece 1 and disposed with a distance apart from the latter and extends almost up to its upper edge. The lower end of the beam tube 10 is configured as a flange 11 extending radially outwards. Further, the electrostatic lens includes a terminal electrode 12 as a second electrode continuing in the direction of traversal of the charged particles from the outer pole piece 2, respectively from its end 2' (disposed closer to the objective plane 102 than the inner end 2' of the outer pole piece 2).

The beam tube 10 and the terminal electrode 12 are held in position via an electrode holder 13 and a first sealing member 20 as well as a first connection piece 16. The electrode holder 13 includes a conical holding member extending parallel to an outer face of the outer pole piece and is vacuum tightly connected to a component different from the magnetic lens, such as for example a vacuum chamber boundary member 14 of a particle-optical system including the objective lens 100. The first sealing ring 20 includes a ring, such as a disk provided with an opening made of insulating ceramics, and substantially extends radially between the lower end of the electrode holder 13 and the lower end of the beam tube 10, where it is suitably fixed. The terminal electrode 12 is mounted to the first sealing ring 20 using the first connection piece 16. Thereby, a fixing of the first and second electrodes 10, 12 relative to each other as well as an electric insulating the first electrode 10 from the second electrode 12 is effected. A voltage source for applying potentials to the first electrode and second electrode (to the beam tube 10 and the terminal electrode 12) is not illustrated in FIG. 1 to not obscure the drawing. The outer pole piece 2 exhibits in its lower portion a conical shape that transits at its upper end to an L-shape directed outwards. An upper edge of this L-shaped portion is fixed to the vacuum chamber border member 14 via a connecting piece 15. Further, at this L-shaped portion a third sealing 21 is mounted providing a vacuum tight sealing between the outer pole piece 2 and the vacuum chamber border member 14. The third sealing 21 is in the present exemplary embodiment configured as a diaphragm bellows. A further diaphragm bellows is mounted as second sealing 22 at an upper end of the beam tube 10 and provides a vacuum tight connection to a component 103 continuing upwards which may be a component of the particle-optical system including the objective lens 100. The component 103 may for example be an electrode or a diaphragm or any other component to which may be suitably sealed. Thus, by the second sealing 22 a second sealing member for the particle-optical system is provided. By the electrode holder 13, the sealing 20 and the third sealing 21 commonly a first sealing member for the particle-optical system is provided preventing traversal of gas through an interspace between the outer pole piece 2 and the beam tube 10.

The inner pole piece 1 substantially exhibits a L-shape, wherein the short side of the L is directed radially outwards. The inner pole piece 1 exhibits a plane face 1S (at the short side) abutting on a plane face 2S of the outer pole piece 2. By these abutting, relative to each other displaceable plane faces 1S and 2S a displaceable mounting of the two pole pieces 1 and 2 is achieved. To be able to achieve a changing a position of the inner pole piece 1 relative to a position of the outer pole piece 2, the objective lens 100 includes a first actuator 31. The actuator 31 includes a screw fixed to the outer pole piece 2 using a fixing piece 18, wherein an end of the screw 31 contacts an outer edge of the inner pole piece 1. Thus, rotating the screw 31 causes a radial displacement of the inner pole piece 1 relative to the outer pole piece 2. The actuator 31 is adapted to change the relative positions of the pole piece 1 and the pole piece 2 in a direction transverse to the direction 101 of traversal of the charged particles through the objective lens 100. Further, actuators not illustrated in the sectional view of FIG. 1, are provided to change the relative positions of the inner pole piece and the outer pole piece in another direction transverse to the direction 101 of transversal of the charged particles that is substantially orthogonal to the direction of changing the positions described above. The rotating of the screw 31 may be performed by an external driving mechanism, such as a motor. The objective lens further includes a second actuator 32, a screw 32 in the illustrated embodiment, fixed to the vacuum chamber border member 14 via a connecting piece 17. The end of the screw 32 contacts an outer edge of the outer pole piece 2 so that rotating the screw 32 causes a displacement of the inner pole piece 1 and the outer pole piece 2 relative to the electrostatic lens having the beam tube 10 and the terminal electrode 12. Thus, a adjusting the optical axis of the electrostatic lens and the optical axis of the magnetic lens relative to each other is enabled so that both optical axes coincide and in particular good imaging properties of the objective lens may be provided. The coinciding optical axes are illustrated in FIG. 1 as a common optical axis OA.

In the exemplary embodiment illustrated in FIG. 1 the inner pole piece exhibits in the inner space traversed by the charged particles (in its cylindrical section) a constant diameter $D_i$ of 15 mm. The diameter of the inner end 2' of the outer pole piece has a diameter $D_a$ amounting to 30 mm. Thus, the diameter $D_a$ of the inner end 2' of the outer pole piece 2 is two times the diameter $D_i$ of the inner pole piece 1. A distance H between the lower end 1' of the inner pole piece 1 and the inner end 2' of the outer pole piece 2 amounts to 4 mm in the illustrated embodiment.

Figure 5:
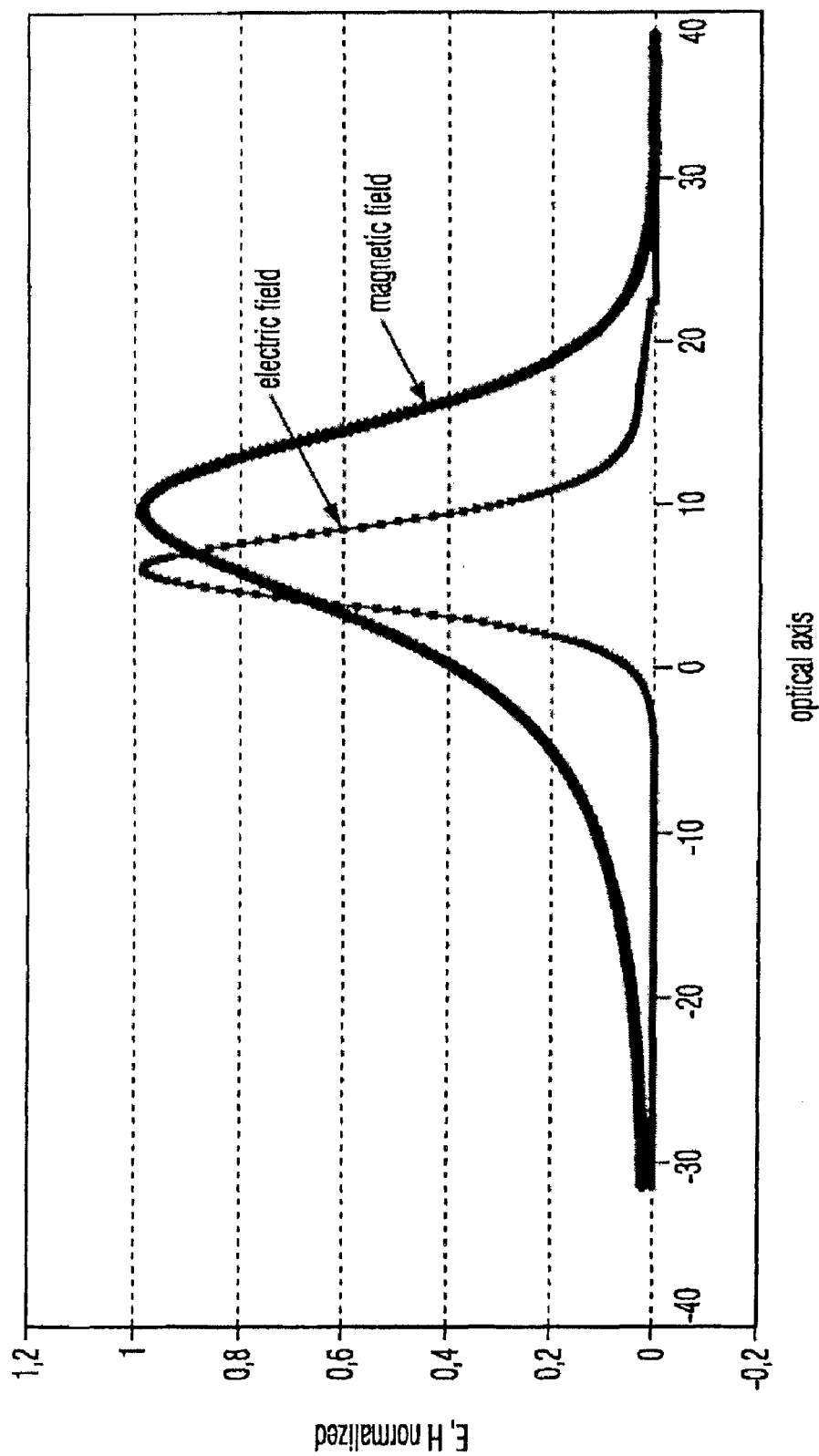
FIG. 5 is an illustration of graphs of intensities of the magnetic and electric fields generated by the objective lens illustrated in FIG. 1 along the optical axis.

This configuration of the magnetic lens having an inner pole piece and an outer pole piece leads to the property that the magnetic field compared to conventional objective lenses protrudes further into the space in front of the lens so that it overlaps with the electrostatic field of the lens in an advantageous way. This is exemplarily apparent from FIG. 5 in which normalized intensities of the magnetic field and the electric field are illustrated in dependence of a position along the optical axis. A distance between the maximum of the magnetic field and the maximum of the electric field amounts in the illustrated example to about 3.7 mm. Such an overlap of the electric and magnetic fields causes smaller error coefficients of the objective lens and thus leads to a better resolution, in particular in a larger range of working distances. A direction towards positive values along the x-axis in FIG. 5 representing positions in units mm along the optical axis OA corresponds to a direction from the objective plane 102 towards the objective lens 100. The objective plane 102 is located at negative values in FIG. 5 at around −2 mm to −5 mm.

The configuration of the magnetic field generated by the geometry of the inner pole piece and the outer pole piece is substantially not effected by the further components disposed in the region of the pole piece gap or disposed in front of this pole piece gap in a direction towards the objective plane, such as the components 13, 16, 20 and 11, since these components are made of materials having relative permeability of for example $\mu_r \leq 1.001$.

Figure 2:
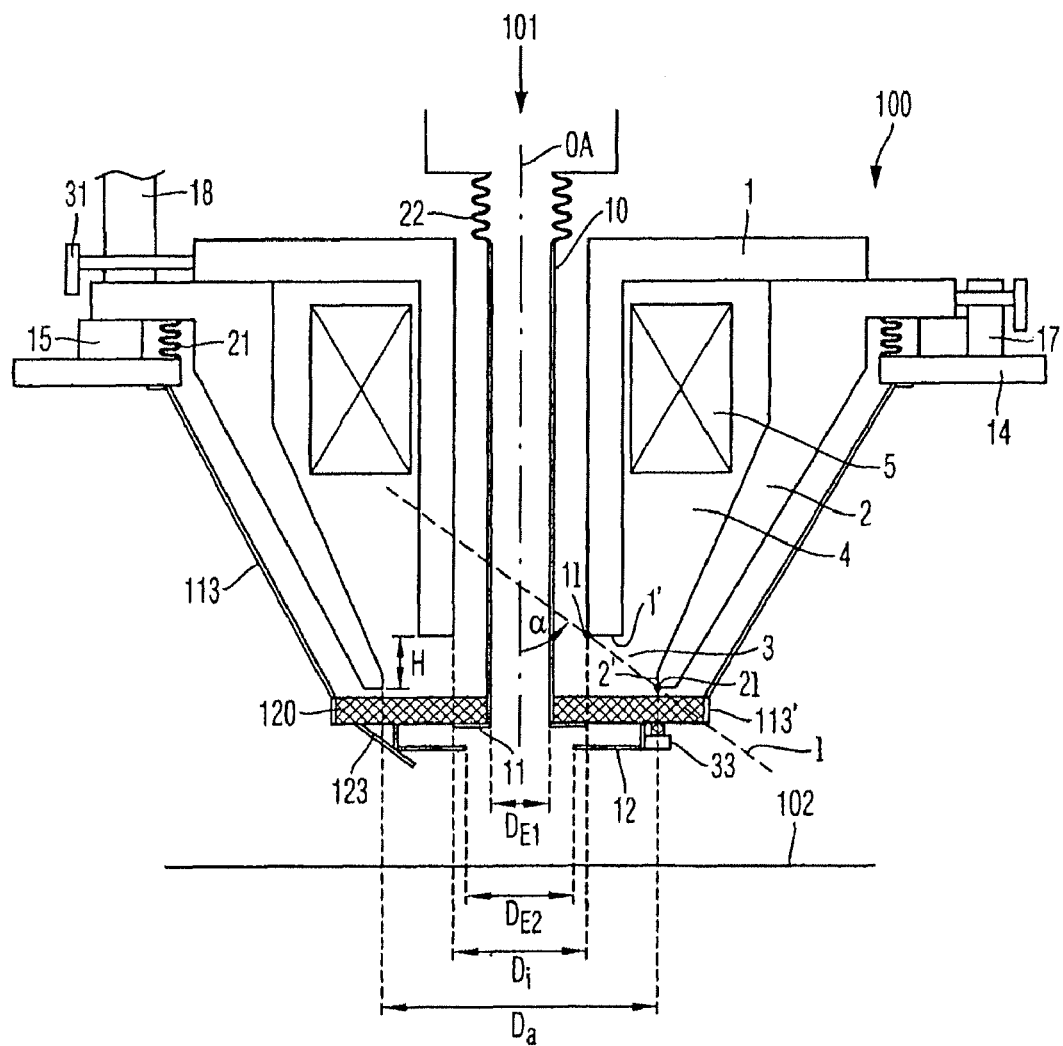
FIG. 2 is an objective lens.

In FIG. 2 a second exemplary embodiment of an objective lens 100 according to the present invention is illustrated. This exemplary embodiment differs from the embodiment illustrated in FIG. 1 mainly in that the terminal electrode provided as the second electrode 12 is displaceably arranged relative to the beam tube 10. Furthermore, the construction of the electrode holder 113 and the first sealing ring 120 is modified compared to the corresponding elements in FIG. 1. The electrode holder 113 in this exemplary embodiment extends substantially parallel to an outer face of the outer pole piece 2 up to a lower end 113'. This lower end 113' exhibits a larger inner diameter than the inner end 2' of the outer pole piece 2. The lower end 113' extends substantially orthogonally to the object plane 102. The lower end 113' of the electrode holder 113 is formed in an annular shape. The sealing ring 120 configured, compared to the first exemplary embodiment, larger extends from the annular lower edge 113' of the electrode holder 113 to the lower end of the beam tube 10 and abuts the terminal flange 11 of the beam tube 10. Thus, in this exemplary embodiment, a vacuum tight sealing between the electrode holder and the beam tube 10 is provided so that traversal of gas (a pressure balancing) via an interspace formed between the terminal flange 11 and the inner end 2' of the outer pole piece is prevented. The terminal electrode 12 is held at the first sealing ring 120 using brackets 123. Further, a third actuator 33 is provided enabling a mechanical displacement of the terminal electrode 12 relative to the beam tube 10. This third actuator may for example be a piezo-element. The first and the second actuator may also be piezo-elements.

Diameter $D_i$ of the inner pole piece 1 and diameter $D_a$ of the inner end 2' of the outer pole piece 2 are the same as these in FIG. 1. Further, in this FIG. 2, a diameter $D_{E1}$ of the beam tube 10 and a diameter $D_{E2}$ of an aperture enclosed by the terminal electrode are illustrated. These diameters amount in the illustrated embodiment to $D_{E1}$=4.2 mm and $D_{E2}$=5 mm. The remaining components of this second exemplary embodiment illustrated in FIG. 2 correspond to these described with reference to FIG. 1.

Also illustrated in FIG. 2 is a line l touching the lower end of the inner pole piece 1 at a point 11 and touching the inner end of the outer pole piece at a point 21. The line l intersects the optical axis OA, wherein the line l and the optical axis OA include an angle α. The angle α characterizes an amount of a tilting of the pole piece gap formed between the lower end of the inner pole piece 1 and the inner end of the outer pole piece 2 relative to the optical axis OA of the objective lens. A tangent of this angle α is the ratio between half of the difference between the diameter $D_a$ and the diameter $D_i$ and the distance H between the lower end of the inner pole piece 1 and the inner end of the outer pole piece 2. In the illustrated embodiment the angle α amounts to about 45°. In other exemplary embodiments of the present invention α may assume other values such as 30°, 40°, 50°, 60°.

In the exemplary embodiment illustrated in FIG. 2 the fixing piece 18 illustrates a portion of a vacuum chamber wall of a particle-optical system. Thus, the objective lens 100 illustrated in FIG. 2 may be fixedly mounted to the vacuum chamber wall of the particle-optical system via the outer pole piece 2 of the magnetic lens. Thereby the inner pole piece 1 and, via the inner space 4 between the inner pole piece 1 and the outer pole 2, also the outer pole piece 2 may be exposed to atmospheric pressure, while the vacuum chamber wall surrounds the object plane 102 to maintain a vacuum in the object region.

The objective lens 100 fixedly mounted within a vacuum chamber of a particle-optical system can then be adjusted using the actuators 31 to adjust an inclination of the optical axis of the magnetic lens, the actuator 33, to adjust an inclination of the optical axis of the electrostatic lens, and the actuator 17 to adjust a relative position of the optical axis of the magnetic lens and the optical axis of the electrostatic lens.

Other ways for mounting the objective lens 100 according to the present invention to a vacuum chamber of a particle-optical system are envisaged. For example, instead of mounting the objective lens 100 via the outer pole piece 2 and the connecting piece 18 to a chamber wall of a vacuum chamber of a particle-optical system, the objective lens 100 may be fixedly mounted to a vacuum chamber wall of the vacuum chamber of the particle-optical system by fixedly mounting for example the beam tube 10 to the chamber wall of the vacuum chamber of the particle-optical system. In this case the connecting piece 18 is not fixedly connected to the chamber wall of the vacuum chamber of the particle-optical system. Instead of mounting the objective lens via the connecting piece 18, the objective lens can also be mounted via the vacuum chamber border member 14 to the particle optical system.

Figure 3:
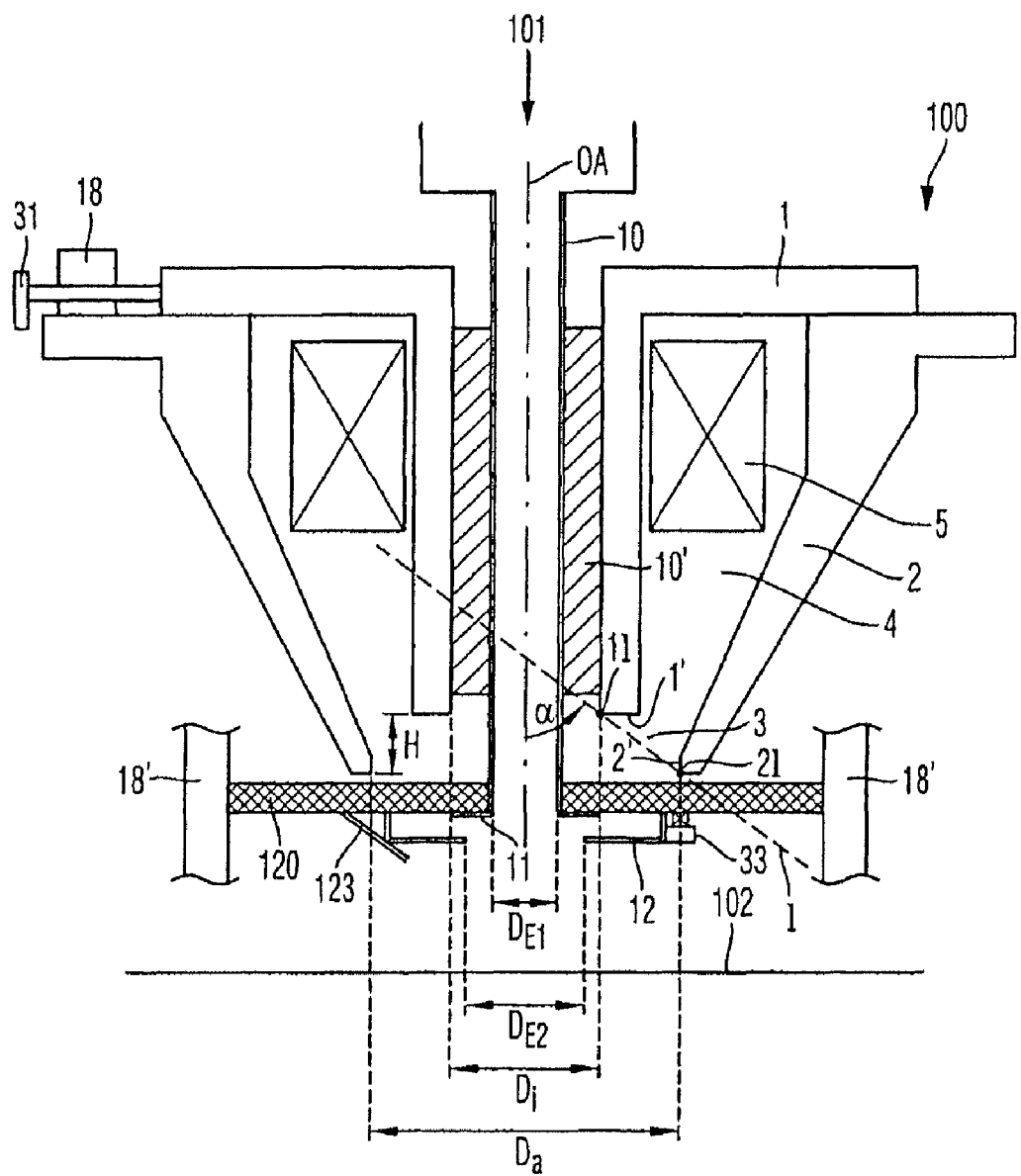
FIG. 3 is an objective lens.

FIG. 3 illustrates a further exemplary embodiment of an objective lens 100 according to the present invention. The exemplary embodiment illustrated in FIG. 3 is similar to the exemplary embodiment in FIG. 2. The two exemplary embodiments, however, differ in that in the embodiment illustrated in FIG. 3 the electrostatic lens can not be displaced relative to the magnetic lens as a whole. Thus, in this exemplary embodiment, the actuator 17 is not present. Instead, the beam tube 10 and the inner pole piece 1 are held in a fixed positional relationship by interposing an insulating material 10' between an outer circumferential face of the beam tube 10 and the inner cylindrical face of the inner pole piece 1. Since a relative displacement of the magnetic lens relative to the electrostatic lens is not enabled in the exemplary embodiment illustrated in FIG. 3, the electrode holder 113 is not needed. The exemplary embodiment illustrated in FIG. 3 of the objective lens 100 allows in an analogous way as the exemplary embodiment illustrated in FIG. 2 adjusting a position of the first electrode relative to a position of the second electrode via the actuator 33 and adjusting a position of the outer pole piece 1 relative to a position of the inner pole piece 2 via the actuator 31. As mentioned in the context of the description of the exemplary embodiment illustrated in FIG. 2, there are several opportunities to fixedly mount the objective lens 100 illustrated in FIG. 3 to a vacuum chamber wall of a vacuum chamber of a particle-optical system. For example, the fixedly mounting may be effected via the connecting piece 18 being fixedly mounted to the outer pole piece or it may be effected by fixedly mounting for example the beam tube 10 to the chamber wall of the vacuum chamber of the particle-optical system.

However, such mounting can also be carried out as illustrated in FIG. 3, wherein the sealing ring 120 extends from a lower end of the beam tube 10 substantially parallel to the objective plane 102 in a radial direction outwards up to a portion 18' of a chamber wall of a vacuum chamber of a particle-optical system and is fixedly mounted thereto. The kind of mounting the objective lens 100 within a particle-optical system may depend on the particular application.

Figure 4:
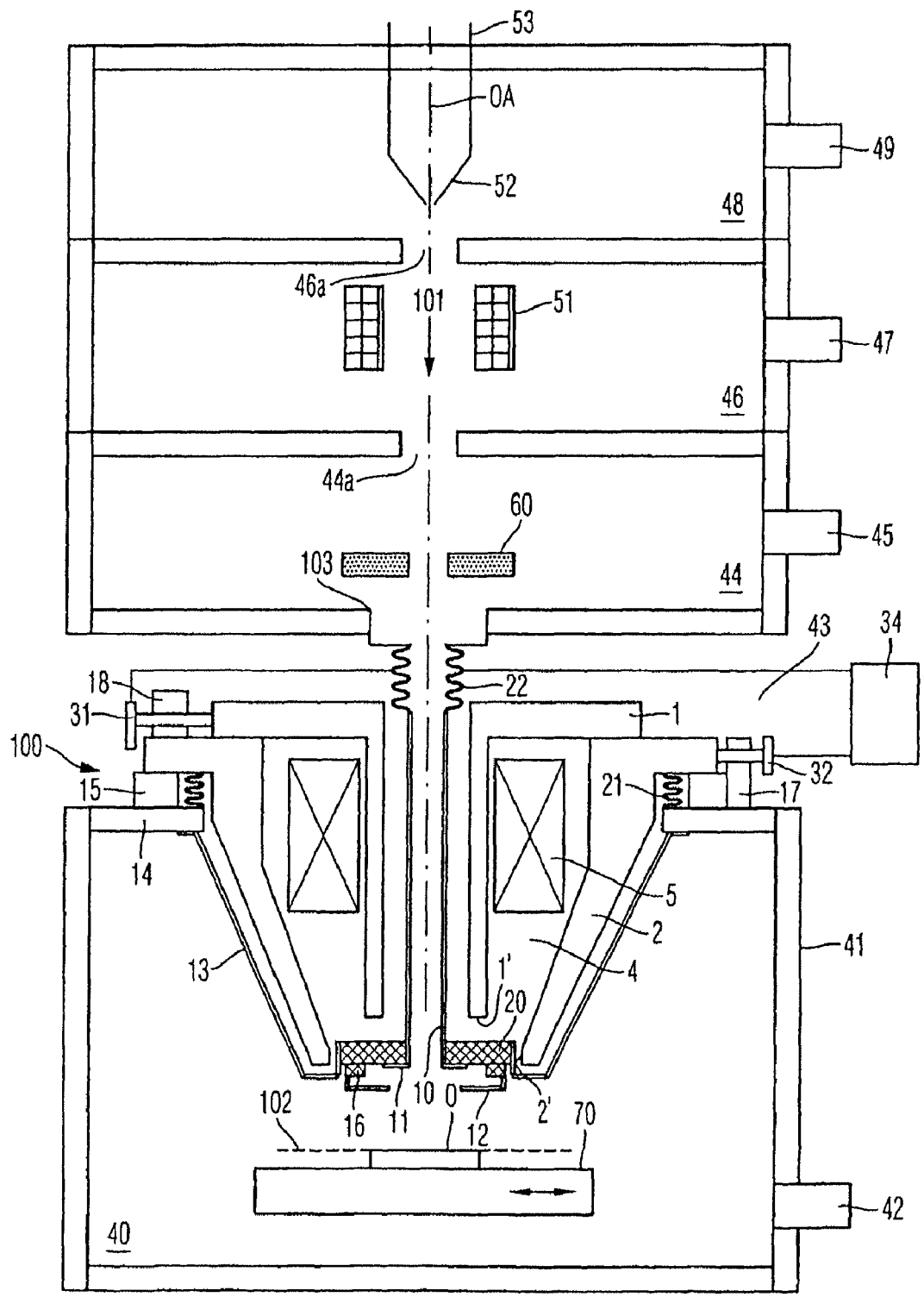
FIG. 4 is a simplified, schematic view of a particle optical system having an objective.

FIG. 4 illustrates an exemplary embodiment for a particle-optical system according to the present invention in which the objective lens 100 according to the first exemplary embodiment is used. The particle-optical system of this exemplary embodiment is adapted as an electron microscope. The typical components of such an electron microscope are well-known in the art and thus will only briefly be mentioned in the following.

The electron microscope includes an electron source 53 depicted very roughly. The electron source 53 includes a tungsten wire 52 which emits electrons in a direction 101 extracted by an electric acceleration field towards an anode. The electron source 53 is arranged in a vacuum space 48 which is partly separated from a subsequent vacuum space 46 by a diaphragm 46a. Vacuum space 48 includes a connection 49 to a not illustrated vacuum pump. In vacuum space 46 a schematically indicated condenser lens 51 is illustrated. Vacuum space 46 includes a connector 47 to a not illustrated vacuum pump. Vacuum space 46 is at least partly separated from the subsequent vacuum space 44 by diaphragm 44a. In vacuum 44 a detector 60 is disposed. The detector is a conventional electron detector which due to its location inside of the electron microscope is also referred to as inlens detector. The vacuum space 44 is connected to a not illustrated vacuum pump via a connector 45. The vacuum space 44 is vacuum tightly connected to the upper end of the beam tube 10 by the connecting member 103 and diaphragm bellow 22. Thus, via sealing ring 20 and sealings 21 and 22 a separation of a vacuum chamber 40 from a space 43 is achieved in which space the magnetic lens and the first and second actuators are arranged.

The first and second actuators 31, 32 may be controlled using handling member 34. Thereby, and by the positioning of the displaceable parts in a space not under vacuum, it is possible to perform adjusting the corresponding components relative to each other externally controlled and during the operation of the electron microscope.

The vacuum chamber 40 is bounded by vacuum chamber boundary members 14 and 41. The vacuum chamber 40 exhibits a connector 42 to a vacuum pump. In the vacuum chamber 40 a object holder 70 is arranged which is configured and arranged to hold an object O and, as desired, to displace the object in different directions. A surface of the object O can be arranged in the object plane 102. Also not illustrated in this Figure for simplicity are a current source for supplying the coil 5 as well as a voltage source for applying potentials to the first and/or the second electrodes 10, 12. The electron microscope may also include deflecting members for deflecting the electron beam and further components.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. An objective lens, comprising:
    a magnetic lens having an optical axis, the magnetic lens comprising an inner pole piece and an outer pole piece, wherein a gap is formed between a lower end of the inner pole piece and an inner end of the outer pole piece, wherein the outer pole piece has a substantially conical shape having a diameter $D_a$ at its inner end, and the inner pole piece has a diameter $D_i$ at its lower end, wherein the lower end of the inner pole piece is arranged at a distance H, when measured along a direction of the optical axis, apart from the inner end of the outer pole piece, wherein the inner end of the outer pole piece is a functional part of the magnetic lens disposed closest to an object plane of the objective lens, wherein the inner pole piece and the outer pole piece are displaceable relative to each other, and wherein the following conditions are fulfilled:

$1.5 \cdot D_i \leq D_a \leq 3 \cdot D_i$ and $25° \leq \alpha \leq 70°$ where $\alpha = \arctan((D_a - D_i)/(2*H))$.

2. The objective lens according to claim 1, wherein $30° \leq \alpha \leq 40°$.

3. The objective lens according to claim 1, wherein H is at least 2 mm.

4. The objective lens according to claim 1, wherein H is at most 10 mm.

5. The objective lens according to claim 1, further comprising a first actuator configured to change a position of the inner pole piece relative to a position of the outer pole piece.

6. The objective lens according to claim 5, further comprising an electrostatic lens comprising an electrode arrangement configured to generate an electrostatic field, wherein the electrode arrangement comprises a first electrode and a second electrode offset from each other in a direction of the optical axis.

7. The objective lens according to claim 6, further comprising a second actuator adapted to change a position of the first electrode relative to a position of the second electrode and/or relative to the position of the outer pole piece.

8. The objective lens according to claim 6, wherein the first electrode is a beam tube at least partially traversing the inner pole piece and the second electrode is a terminal electrode disposed offset from the beam tube and continuing, in a direction towards the object plane, from the outer pole piece towards the object plane.

9. The objective lens according to claim 6, wherein the first actuator is adapted to displace the inner pole piece and/or the outer pole piece relative to the first and/or the second electrode of the electrode arrangement.

10. The objective lens according to claim 6, wherein H is at least 2 mm, and H is at most 10 mm.

11. The objective lens according to claim 10, one of the following conditions holds:

$30° \leq \alpha \leq 40°$, $40° \leq \alpha \leq 50°$, or $50° \leq \alpha \leq 60°$.

12. A system, comprising:
an objective lens according to claim 11,
wherein the system is an electron microscope.

13. A system, comprising:
an objective lens according to claim 10,
wherein the system is an electron microscope.

14. The objective lens according to claim 6, one of the following conditions holds:

$30° \leq \alpha \leq 40°$, $40° \leq \alpha \leq 50°$, or $50° \leq \alpha \leq 60°$.

15. A system, comprising:
an objective lens according to claim 14,
wherein the system is an electron microscope.

16. A system, comprising:
an objective lens according to claim 6,
wherein the system is an electron microscope.

17. The objective lens according to claim 1, wherein 40° a 50°.

18. The objective lens according to claim 1, wherein $50° \leq \alpha \leq 60°$.

19. The objective lens according to claim 1, wherein H is at least 2 mm, and H is at most 10 mm.

20. A system, comprising:
an objective lens according to claim 1,
wherein the system is an electron microscope.

* * * * *

UNITED STATES PATENT AND TRADEMARK OFFICE
CERTIFICATE OF CORRECTION

| | | |
|---|---|---|
| PATENT NO. | : 8,362,443 B2 | Page 1 of 1 |
| APPLICATION NO. | : 13/449435 | |
| DATED | : January 29, 2013 | |
| INVENTOR(S) | : Volker Drexel | |

It is certified that error appears in the above-identified patent and that said Letters Patent is hereby corrected as shown below:

Column 5,
Line 8, delete "substractive" and insert --subtractive--

Column 5,
Line 16, delete "for example ceramic, element" and insert --for example, ceramic element--

Column 5,
Line 45, delete "camber" and insert --chamber--

Column 9,
Line 31, delete "of the"

Column 11,
Line 6, delete "15" and insert --1S--

Signed and Sealed this
Second Day of April, 2013

Teresa Stanek Rea
*Acting Director of the United States Patent and Trademark Office*